United States Patent [19]

Gelbart

[11] Patent Number: 6,136,509
[45] Date of Patent: Oct. 24, 2000

[54] METHOD OF EXPOSING THERMORESIST

[75] Inventor: Daniel Gelbart, Vancouver, Canada

[73] Assignee: Creo Srl, Burnaby, Canada

[21] Appl. No.: 09/093,854

[22] Filed: Jun. 5, 1998

[51] Int. Cl.[7] ....................................................... G03F 7/26
[52] U.S. Cl. .......................... 430/311; 430/330; 430/394; 430/397; 430/945
[58] Field of Search ................................. 430/311, 330, 430/394, 945, 964, 270.1, 397

[56] References Cited

U.S. PATENT DOCUMENTS

| | | |
|---|---|---|
| 4,796,038 | 1/1989 | Allen et al. . |
| 5,001,038 | 3/1991 | Dorinski et al. . |
| 5,164,742 | 11/1992 | Baek et al. ................................. 346/76 |
| 5,182,188 | 1/1993 | Cole et al. ............................... 430/323 |
| 5,208,818 | 5/1993 | Gelbart et al. ............................ 372/30 |
| 5,229,872 | 7/1993 | Mumola ..................................... 359/40 |
| 5,296,891 | 3/1994 | Vogt et al. ................................ 355/67 |
| 5,298,761 | 3/1994 | Aoki et al. . |
| 5,311,360 | 5/1994 | Bloom et al. ............................ 359/572 |
| 5,314,785 | 5/1994 | Vogel et al. .............................. 430/269 |
| 5,328,811 | 7/1994 | Brestel ..................................... 430/325 |
| 5,340,699 | 8/1994 | Haley et al. ............................ 430/302 |
| 5,372,907 | 12/1994 | Haley et al. ............................ 430/157 |
| 5,372,915 | 12/1994 | Haley et al. ............................ 430/302 |
| 5,450,099 | 9/1995 | Stephenson et al. .................... 347/200 |
| 5,461,455 | 10/1995 | Coteus et al. . |
| 5,466,557 | 11/1995 | Haley et al. ............................ 430/278 |
| 5,512,418 | 4/1996 | Ma ....................................... 430/271.1 |
| 5,515,848 | 5/1996 | Corbett, III et al. .................... 128/642 |
| 5,641,608 | 6/1997 | Grunwald et al. ....................... 430/302 |
| 5,739,898 | 4/1998 | Ozawa et al. . |
| 5,742,362 | 4/1998 | Chikamichi . |
| 5,777,724 | 7/1998 | Suzuki . |
| 5,795,686 | 8/1998 | Takizawa et al. . |
| 5,847,812 | 12/1998 | Ooki et al. . |
| 5,851,707 | 12/1998 | Shibuya et al. . |
| 5,958,647 | 9/1999 | Morgan ................................ 430/270.1 |

FOREIGN PATENT DOCUMENTS 0 557 138 A2   8/1993   European Pat. Off. .

OTHER PUBLICATIONS

Creo Trendsetter Data Sheet (Aug. 1997).
Creo Difine 4LF Thermoresist Data Sheet, May 1998.
Ooki et al. *Experimental study on non–linear multiple exposure method.* SPIE vol. 3051, pp. 85–93.
Neisser et al. *Simulation and Experimental Evaluation of Double Exposure Techniques.* SPIE vol. 3334, pp. 372–377.

*Primary Examiner*—Christopher G. Young
*Attorney, Agent, or Firm*—Oyen Wiggs Green & Mutala

[57] ABSTRACT

Low contrast optics, including low contrast linear light valves, can be used to create high resolution patterns by using thermoresist instead of photoresist and by using multiple exposures of the same area, preferably exposing different features of the pattern in each exposure. When using thermoresist, the stray light from imaging the individual features does not add up, as the stray heat it creates will dissipate between exposures. The method is particularly useful for imaging thermoresists using UV light for manufacturing of integrated circuits.

22 Claims, 5 Drawing Sheets

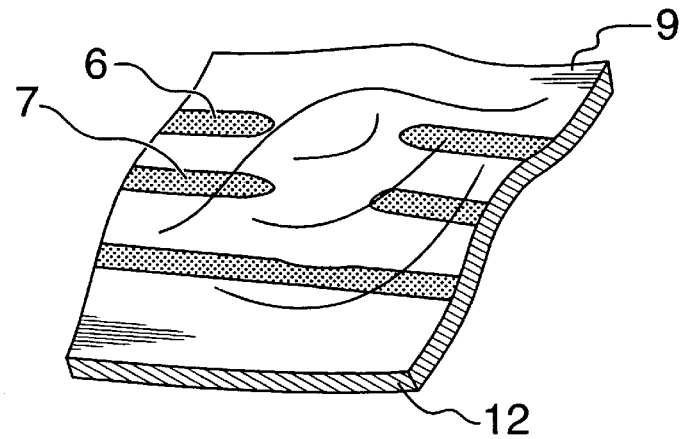
FIG. 5-a
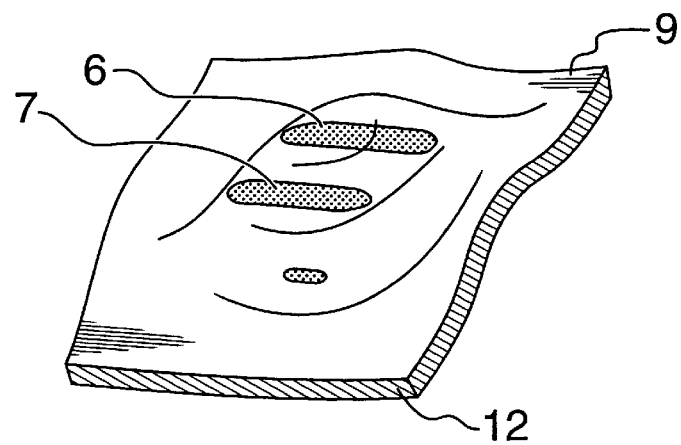
FIG. 5-b
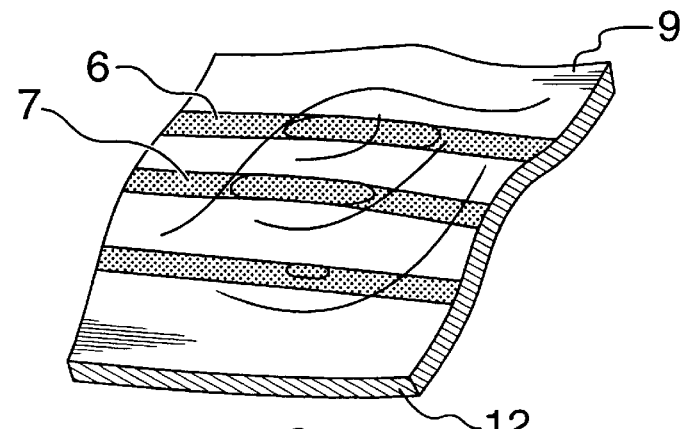
FIG. 5-c

METHOD OF EXPOSING THERMORESIST

CROSS REFERENCE TO RELATED APPLICATIONS

The subject matter of this application is related to the subject matter of co-pending and commonly owned application Ser. No. 09/110,378, pending entitled HIGH RESOLUTION OPTICAL STEPPER.

FIELD OF THE INVENTION

The invention relates to imaging of etch resistant layers also known as "resists", in order to fabricate high resolution patterns by etching or deposition. In particular, the invention relates to the manufacturing of integrated circuits, flat panel displays and printed circuit boards.

BACKGROUND ON THE INVENTION

The processes for fabricating high resolution patterns, mainly on planar objects, by selective etching or deposition has been well known for centuries. In general, the layer to be shaped or patterned is covered by a protective layer known as a "resist". The desired shapes are created in the protective layer, usually via photo-imaging. The exposed (or unexposed, if the resist is negative working) part of the image is removed, normally by using a liquid developer to expose the layer underneath. The exposed layer can now be etched through the openings in the resist layer, which protects the covered area from the etching process. Etching can be by wet chemicals or by dry plasma (a process widely used in the semiconductor industry). Instead of etching an additive process can be used. In additive process a material is deposited through the openings in the resist to add to the layer underneath the resist. This deposition can be done in a wet process (as in the well known "additive" process for manufacturing printed circuit boards) in a dry process, such as a vacuum deposition by evaporation or sputtering. Another way of using a resist is in allowing chemical reactions, such as oxidation, to occur only in the areas not covered by the resist.

In general, a resist is an imagewise mask selectively controlling a chemical or physical process and limiting the process to follow the image pattern. The term "resist" should be interpreted in this broad sense throughout this disclosure and claims. At the end of the process the remaining resist is normally removed, or "stripped". Historically most resists were photoresists, i.e. activated and imaged by the photonic action of the light. Because of this photonic action most photoresists operate in the UV part of the spectrum, where the photon energy is high. Some resists can be exposed by other types of radiation, such as electron-beams. All photoresists and electron-beam resists share one fundamental property: they respond to the total exposure, not to the momentary illumination. In optics, exposure is defined as the integral of illumination over time. For example, a photoresist can be exposed by 100 mW/cm$^2$ for 1 sec to yield 100 mJ/cm$^2$ (100 mw×1 sec) or it can be exposed by 1000 mW for 0.1 sec with similar results. (1000 mW×0.1 sec=100 mJ/cm$^2$). This law is also known as "reciprocity law" and it is the basic law governing the exposure of photoresists. When a certain exposure is reached, a change occurs in the resist. The most common resists operate by a change of solubility in a developer.

The law of reciprocity also requires a high contrast ratio and low stray light in optical systems used to exposure photoresists and electron beam resists. For example, if an exposure system has a light leakage, or stray light, of 1% (e.g.: when exposure is "off", the light level does not drop to zero but only to 1% of the "on" state) the effect of this stray light can be as large (or larger) than the main exposure if left on the photoresist for a long time.

An even larger problem is caused when trying to image high resolution features: the point spread function of the optical system causes a "spreading" of light from each feature. This causes light from on feature to overlap with adjacent features and lower the resolution. This is shown in FIG. 1. Feature 1 has a light distribution 1' and feature 3 has a light distribution 3'. Exposure curve 2, generated by lens 8 imaging feature 1, is added up to exposure curve 4, generated by lens 8 imaging feature 3, to create a curve 5, which is the equivalent exposure. Curve 5 creates a distorted image 6 and 7 of features 1 and 3 on photoresist 9 having a threshold 10. It is important to understand that it makes no difference if exposures 2 and 4 are applied simultaneously or sequentially, as the photoresist will add up, or integrate, the exposures.

Recently a different type of resist, known as thermoresist, has been used in the manufacturing of printing plates and printed circuit boards. A thermoresist (also known as a thermal resist or heat-mode resist) changes solubility when a certain temperature, rather than a certain accumulated exposure, has been reached. Such thermoresists are imaged using near infra-red light and therefore are also known as "IR resists". Some examples of thermoresists are disclosed in the following U.S. Pat. Nos.: 5,340,699 (Haley); 5,372,907 (Haley); 5,372,915 (Haley); 5,466,557 (Haley); 5,512,418 (Ma); 5,641,608 (Grunwald); 5,182,188 (Cole); 5,314,785 (Vogel) and 5,328,811 (Brestel). The thermoresist described by Haley is unusual as the same composition acts as a photoresist, obeying the reciprocity law, when exposed by UV light (at low power density) but also acts as a thermoresist, responding only to temperature, when heated up by IR at high power density. Thermal resist is also available from Creo Ltd. (Lod Industrial Park, Israel), sold under the trade name "Difine 4LF". All of the above-mentioned thermoresists respond to temperature and do not follow the reciprocity law. It is not possible to have a practical true thermoresist which follows the reciprocity law. Such a thermoresist would be exposure simply by long exposed to ambient temperature (just as a photoresist will get exposed by a long exposure to ambient light). While it is possible to shield a photoresist from ambient light it is not possible to shield from ambient temperature. Therefore a practical thermoresist cannot obey the reciprocity law. Prolonged exposure to ambient temperature below the threshold temperature has little effect on a thermoresist. Obviously, the threshold temperature needs to be well above the temperature expected to be encountered in shipping and storage. When chemical reaction in a thermoresist does not have a sharp threshold temperature, the chemical composition has to be formulated to keep the reaction rate very low at room temperature. This is not difficult to do, as most chemical reaction rates approximately double every 10 degrees centigrade. Thus the reaction rate in a thermoresist exposed at 350 degrees centigrade can be a billion times faster than at 25 degrees. Using lasers it is fairly easy to raise the temperature of a thermoresist to over 1000 degrees. Such a thermoresist will appear to have a distinct threshold simply because the reaction rate at lower temperature slows down exponentially. To follow the reciprocity law the reaction rate would have to change in a linear fashion with temperature.

Light valves, also known as multi-channel modulators or spatial light modulators, break up a single light beam into a linear or two-dimensional array of individually addressable spots. An example of using light valves to expose photoresists is shown in U.S. Pat Nos. 5,208,818 (Gelbart) and 5,296,891 (Vogt). Multi-beam, also known as multi-spot, scanning is well known in the art and is used to increase writing speed by exposing a plurality of features simultaneously. The limiting factor in both these patents is the leakage light from the light valves used. Even if the light valves were ideal, the limited optical resolution of the imaging lens creates a problem equivalent to stray light as previously explained.

It is an object of the invention to expose a resist layer using low contrast optical systems, and in particular low contrast light valves. This invention is enabled because thermoresists violate the reciprocity law. Such thermoresists do not integrate the exposure, and any stray heat will dissipate quickly. It is therefore possible to image thermoresists using low contrast (i.e. high light leakage) light valves. Another object of the invention is to increase the resolution achievable in optical lithography by combining the unique properties of thermoresists with the short wavelength of UV light. A further object is to image articles such as integrated circuits, flat panel displays and printed circuit boards without the use of phototools. Phototools is a generic name used to describe the films or glass masks currently used as a master for imaging photoresists via contact or optical projection. Still a further object of the invention is to overcome the shallow depth of focus of today's high resolution exposure machines used to expose integrated circuits by using multiple exposures of thermoresist. These and other objects of the invention will become apparent by considering the following description in conjunction with the drawings.

Low contrast optics, including low contrast linear light valves can be used to create high resolution patterns by using thermoresist instead of photoresist and by using multiple exposures of the same area, preferably exposing different features of the pattern in each exposure. Since thermoresists respond to temperature, the stray light from imaging individual features does not add up as the stray heat it creates will dissipate between exposures. The method is particularly useful for imaging thermoresists using UV light for manufacturing of integrated circuits.

BRIEF DESCRIPTION OF THE DRAWINGS

FIG. 5-a is an isometric view of a non-planar thermoresist layer after being exposed at one focus setting.

FIG. 5-b is an isometric view of a non-planar thermoresist layer when exposed at a different focus setting.

FIG. 5-c is an isometric view of a non-planar thermoresist laser when exposed by two passes, one at the focus setting of FIG. 5-a and a second at setting of FIG. 5-b.

DETAILED DESCRIPTION OF THE PREFERRED EMBODIMENT

Figure 3:
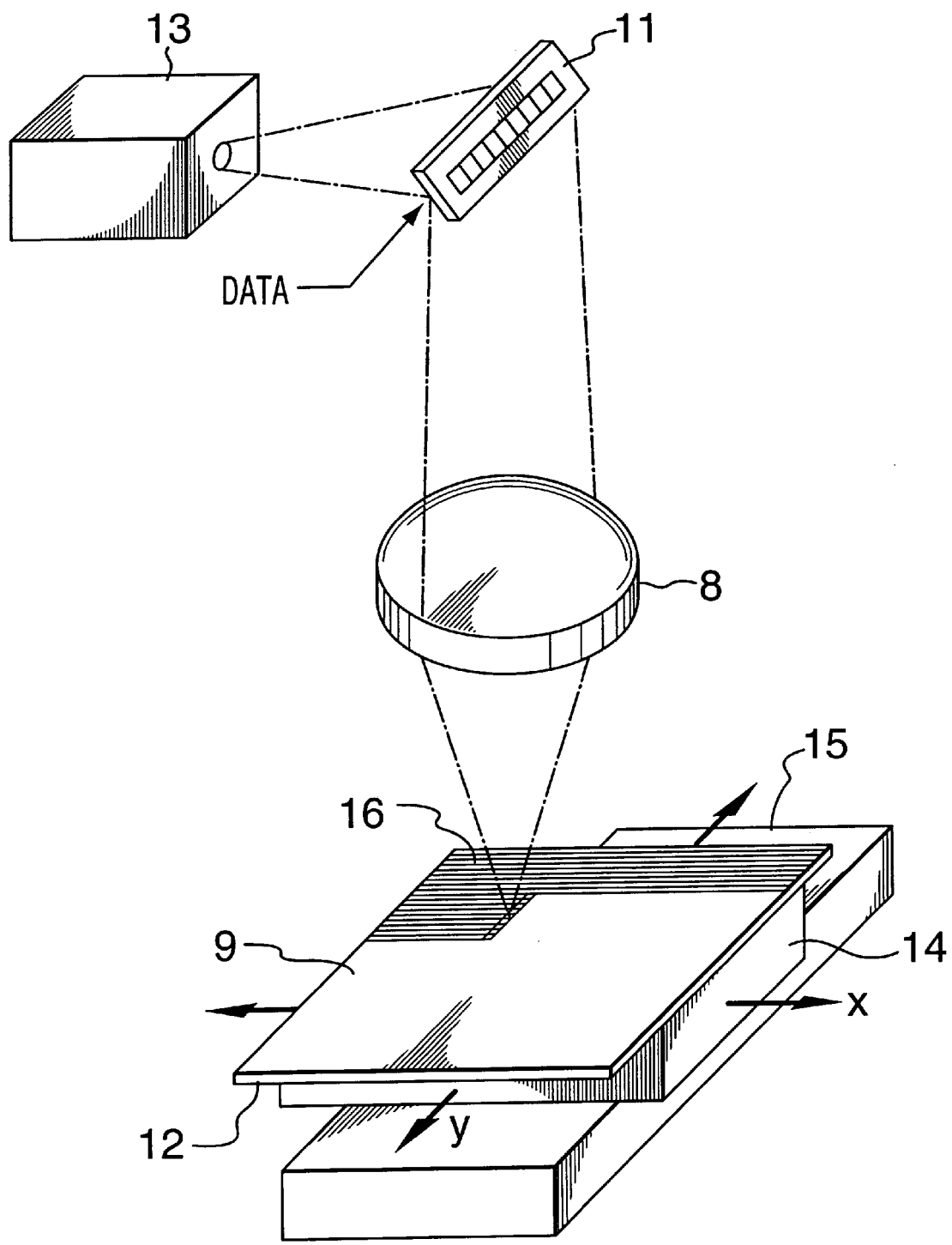
FIG. 3 is an isometric view of a thermoresist exposure apparatus according to the invention.

The apparatus required to reduce the invention to practice is shown schematically in FIG. 3. A laser 13 illuminates a linear light valve 11 which is imaged using lens 8 onto a substrate 12 covered with a thin layer of thermoresist 9. Relative motion is created between the image of light valve 11 and substrate 12 in two dimensions. By way of example, such a motion can be created by mounting substrate 12 on a two dimensional mechanical stage, with slide 14 moving the substrate in the X direction and slide 15 providing motion in the Y direction. Further details of such an apparatus are given in co-assigned U.S. Pat. No. 5,208,818 which is hereby incorporated by reference in this disclosure. If substrate 12 is flexible it can be wrapped on the outside of a cylinder and scanned in the same way as most laser plotters operate. This is possible with thin printed circuit boards.

The area of substrate 12 is covered by contiguous or overlapping stripes 16. For overlapping stripes (i.e. multiple exposures of each area) the methods of U.S. Pat. No. 5,208,818 are preferred. It is also well known in the art that the velocity in the fast scan direction can be sinusoidal or any other velocity profile. All thermoresists today use visible or IR radiation, however in the preferred embodiment laser 13 can be a UV laser such a frequency-quadrupled YAG laser operating at 266 nm. This is desired in order to combine the higher resolution of deep UV light with the increased resolution provided by the invention. A thermoresist exposed by UV light still acts as a thermoresist, i.e. does not obey the law of reciprocity. The UV light is used as a source of heat.

Figure 1:
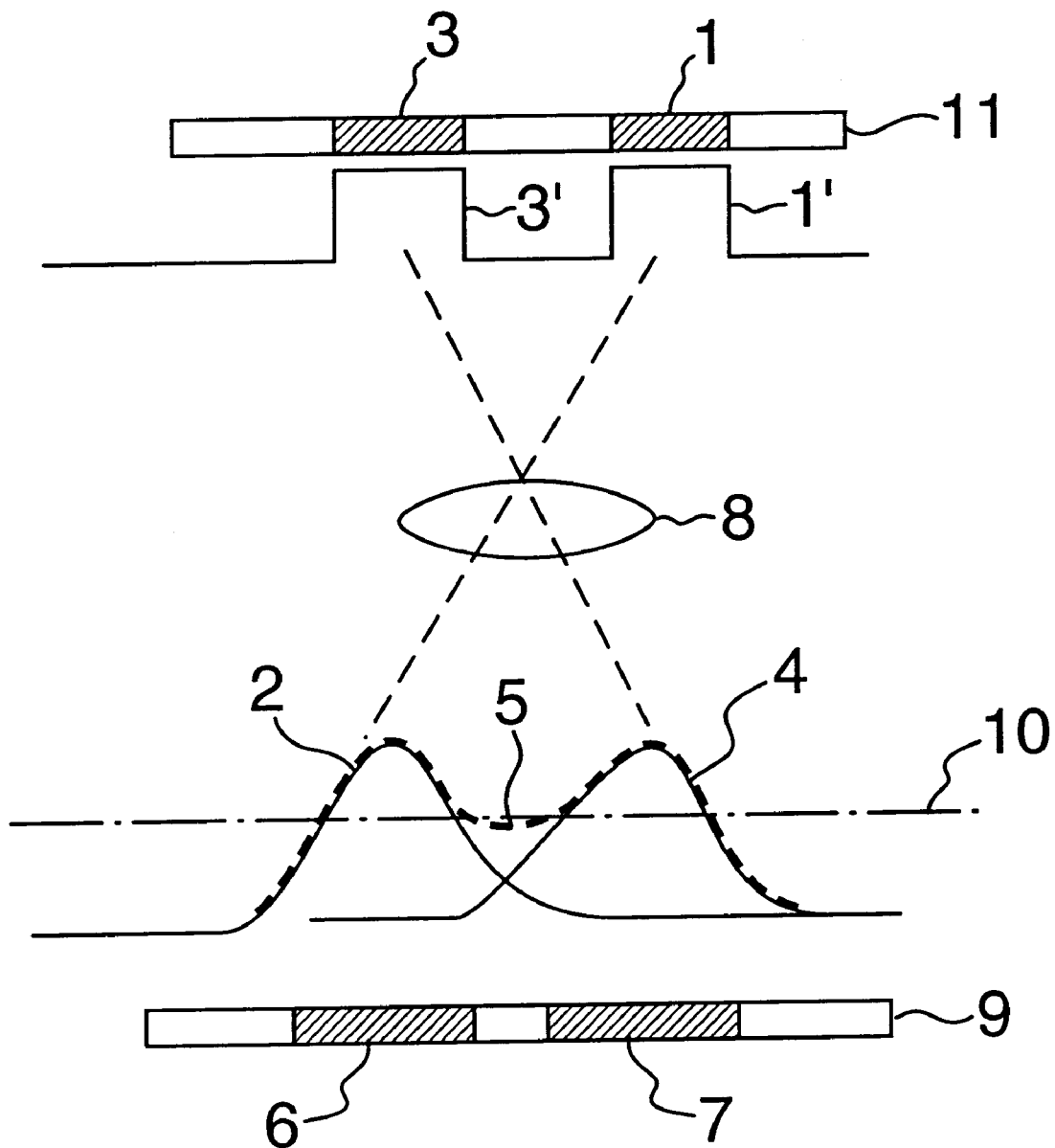
FIG. 1 shows schematically the loss of resolution in prior art imaging caused by the reciprocity law of photoresist.
Figure 2:
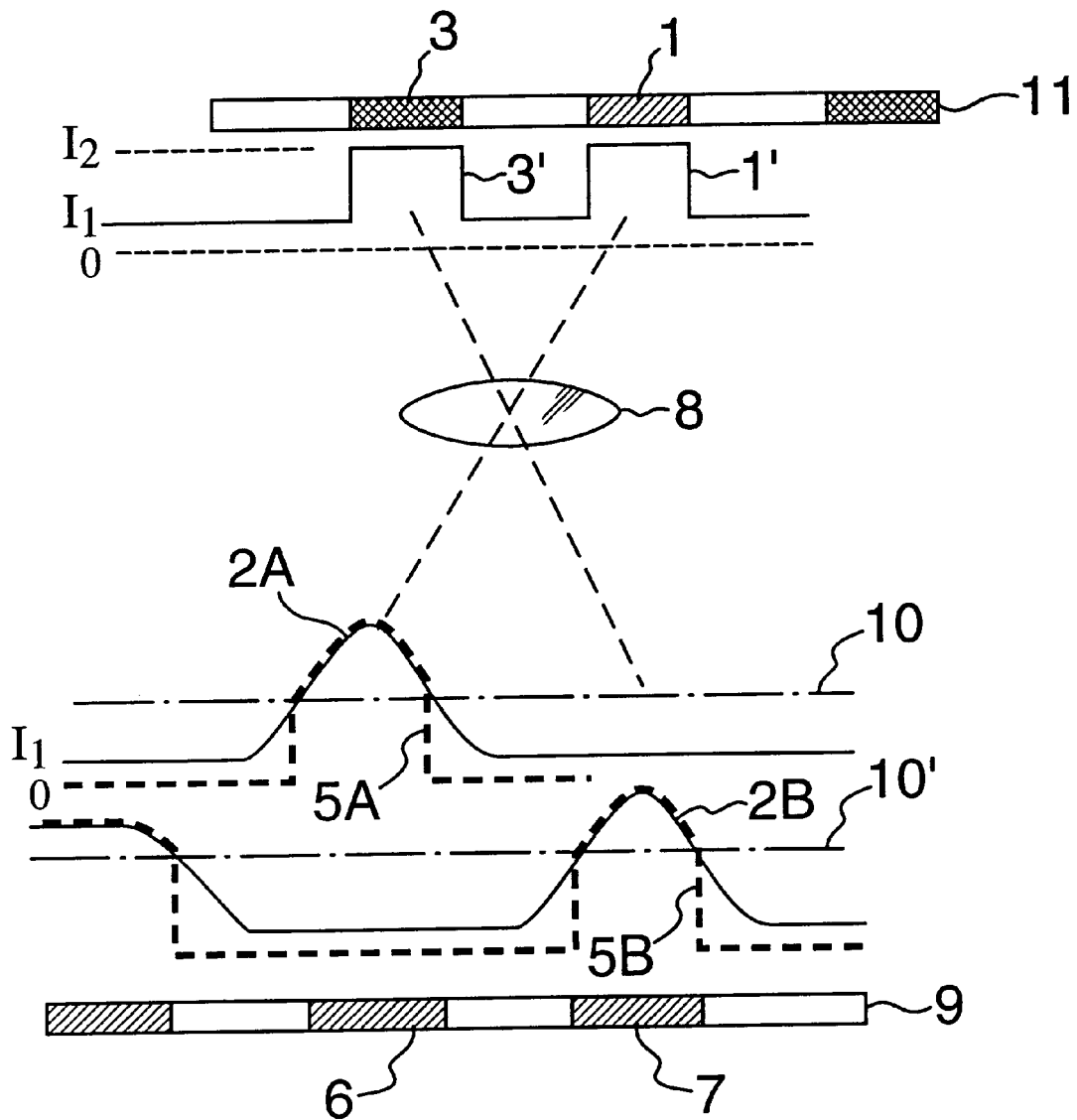
FIG. 2 shows schematically the increased resolution possible by multiple exposures using thermoresist according to the invention.

For the manufacturing of flat panel displays and printed circuit boards laser 13 can be an IR laser or a visible light laser, as the required resolution is lower. A laser diode operating at 830 nm, a YAG laser operating at 1064 nm or frequency doubled YAG operating at 532 nm can be used. While no details of the light valve are given, the most suitable light valves for this invention are linear micromachined light valves, as those available from Silicon Light Machines Inc. (Sunnyvale, Calif.). Referring now to FIG. 2, light valve 11 has features 1 and 3 turned on (a feature can be a single pixel or may comprise multiple pixels). The illumination profile created by these features at the light valve is shown by 1' and 3'.

Note that the illumination level changes from $I_1$ to $I_2$ when the feature is turned on, but does not drop to zero due to the leakage light $I_1$ of the light valve. The ration $I_2/I_1$ is sometimes referred to as "on/off ratio" or "contrast ratio" of the light valve. When this ratio is lower than 100:1, it is usually difficult to expose photoresist with this light valve due to the accumulation of this leakage light, as the photoresist will integrate it. When thermoresist is used the effect of this leakage light is eliminated as any light level below the threshold of the resist will not accumulate, since it is converted to heat which dissipates rapidly. Even better performance can be achieved by exposing the thermoresist with multiple passes.

By the way of example, only feature 1 is enabled on the first pass. As shown in FIG. 2, feature 1 is imaged on thermoresist 9 by lens 8 forming a temperature profile 2A. All points of profile 2A exceeding the threshold temperature 10 will change the solubility of resist 9 (making it more soluble for positive resist and less soluble for negative resist). All points below threshold 10 will have no permanent effect as long as the heat is allowed to dissipate before a second exposure takes place. This changes profile 2A into an effective profile 5A which is much steeper and shows no effect of stray light $I_1$. Since most thermoresist layers are 1–2 microns thick, their thermal time constant is in the order of 1 microsecond. In order to allow the stray heat to dissipate, a delay of a few time constants is used before the second pass, imaging feature 3, is enabled, generating temperature profile 2B. While feature 3 is being imaged, any effects of profile 2A have been dissipated. Profile 5B forms a mark 7 on the thermoresist without being affected by mark 6, formed in the previous exposure. Any resolution limitation of lens 8 causing stray heat has no effect as now only feature 3 is enabled and any stray heat from feature 1 which may have reached location of mark 7 has dissipated. This allows high resolution marking 6 and 7, immune to leakage light from light valve 11 and improving the resolution limits of lens 8. The limit is when curve 2A and 2B do not exceed thresholds 10 and 10'. In this case no mark is formed, even after repeated exposures. Threshold 10' is identical to threshold 10, as the two passes are done at different times but on the same area.

Figure 4:
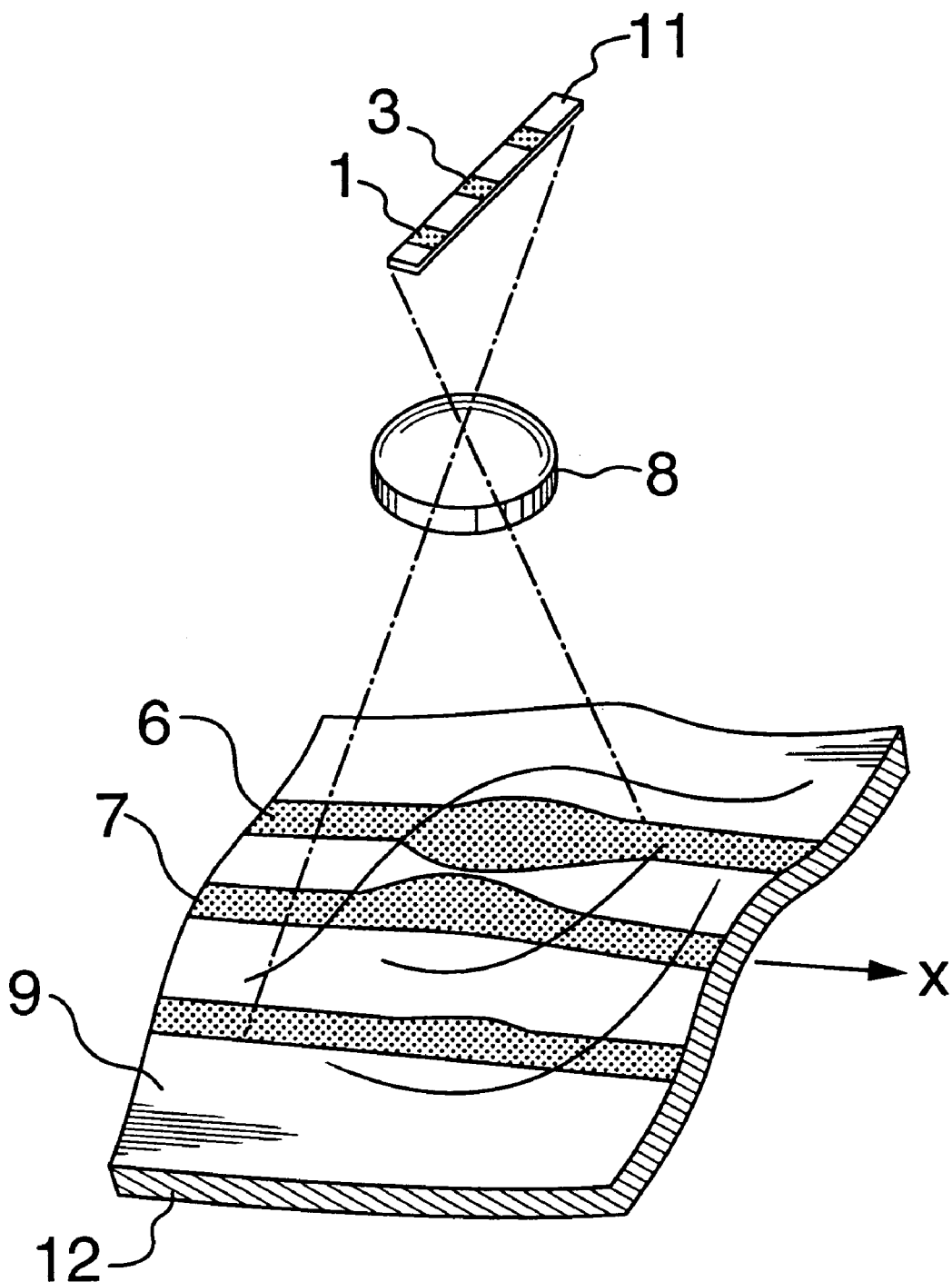
FIG. 4 is an isometric view of a non-planar photoresist on a substrate when exposed by prior art methods.

The key to the invention is the fact that the spatial resolution (i.e. the number of features per unit area) of each exposure can be reduced while the total resolution is the sum of the resolutions used. For example, odd numbered features can be exposed in one pass and even numbered features in next, since there is no interaction between the sequential exposures. The latter effect can be used to a further advantage, as shown in FIGS. 4 and 5. FIG. 4 shows the prior art. A non-planar substrate 12 is covered with photoresist 9 and imaged in an apparatus similar to the one shown in FIG. 3. The deviation from planarity need not be large in order to cause a problem. When making integrated circuits, the depth of focus is below 1 micron due to the large numerical aperture of the lenses used. A deviation of 1 micron can be caused by a build-up of lower layers. Today a CMP process (Chemical-Mechanical Polishing) is used to bring the silicon wafer back to planarity. If lens 8 is focused on the substrate 12 at one point, all points higher or lower will be out of focus causing loss of imaging resolution. For example, narrow lines will widen and merge (or narrow gaps will disappear). When the same substrate (which obeys the law of reciprocity) is imaged again at a different focus setting, all the exposure which was absorbed but did not reach the threshold will add up with the new exposure and destroy the image. The present invention solves this problem by using thermoresist and imaging multiple times, each image at a different focus setting. This is shown in FIG. 5-a to FIG. 5-c. In FIG. 5-a only the lines 6 and 7 which were in focus did cross the threshold temperature and were imaged. The out-of-focus areas did not reach the threshold temperature and the heat dissipated. FIG. 5-b shows the results of imaging the same substrate at a different focus setting. Only the sections of features 6 and 7 that were in focus were imaged. FIG. 5-c shows the imaged substrate of FIG. 5-a, re-imaged with the focus setting of FIG. 5-b. All the features which were out-of-focus in the first exposure are in focus during the second exposure, completing the image of features 6, 7. Clearly more than two exposures may be required if the deviations from planarity are large. As long as the change in focus between the overlapping exposures is less than the depth-of-focus of the exposure, the complete surface of substrate 12 can be imaged.

It is also obvious that this method can be combined with the previously described method of illuminating alternate features on alternate exposures. For example, if features 1 and 3 in FIG. 2 need to be imaged at maximum resolution on a non-planar substrate, at least four exposures will be required, as follows:

First exposure: Feature 1 at first focus
Second exposure: Feature 3 at first focus
Third exposure: Feature 1 at second focus
Fourth exposure: Feature 3 at second focus.

It is also obvious that this method is not limited to thermoresist but can be used with any resist which does not follow the reciprocity law. For critical integrated circuit work the above methods, in combination with UV light are used. For less demanding imaging, such as printed circuit boards, a single pass using IR light is sufficient. While UV light is used in the invention the UV activated thermoresist should not be confused with regular UV photoresist. UV photoresist operates on a photonic principle following the law of reciprocity, while the UV light used to image thermoresist is converted to heat by being absorbed in the resist and the exposure does not follow the law of reciprocity.

Since thermoresist do not follow the law of reciprocity the exposure time is more critical (a low exposure for a long time will have no effect). The lower limit to the exposure time is the ablation of the thermoresist. This typically happens at power densities around 1000 kW/cm$^2$ and normally is undesirable as it creates debris (unless thermoresist was designed to be used in ablation). The upper limit to the exposure time is the escape of heat into the substrate, and it is governed by the thermal time constant of the thermoresist. For most thermoresists the upper limit of exposure time is about 100 microseconds (for a 1 micron layer) and the corresponding power density is below 100 kW/cm$^2$. While existing thermoresist have an absorber dye with a maximum absorbency in the IR, no new dyes are needed for operation in UV as most of these dyes, as well as the polymers used in making the resist, absorb strongly in the UV. This is particularly true for operation at 266 nm, where most materials absorb strongly. Thus the same thermoresist formulation used in the IR can be used at 266 nm and other UV wavelengths.

EXAMPLE

A copper-clad inner layer of a printed circuit board was coated with Difine 4LF thermal resist by dip coating. A pattern of one pixel on/one pixel off was imaged on a Creo Trendsetter operating at 2400 dpi, as well as a 2 pixel on/2 pixel off pattern. Each pixel is about 10.6 microns (1/2400"). After imaging the resist was developed according to the data sheet, using standard developer. The Trendsetter is available from Creo Products Inc. (Vancouver, Canada) and the Difine 4LF thermoresist is available from Creo Ltd. (Lod, Israel). The Trendsetter uses a light valve. The light leakage was set at 5%. Even at this relatively high light leakage, the 2 pixel on/2 off pattern was imaged sharply in a single exposure, far exceeding results achieved with photoresists. The 1 on/1 off pattern was broken up. When the 1 on/1 off pattern was imaged in 2 passes, each pass consisting of 1 on/3 off and passes staggered by 2 pixels (i.e.: odd lines imaged in one pass and even lines imaged in second pass), a good 1 on/1 off pattern was achieved.

What is claimed is:

1. A method for imagewise exposing resists, the method comprising:
   a) providing a light source illuminating a light valve;
   b) forming an image of the light valve on a surface bearing a resist;
   c) creating a two-dimensional relative scanning motion between the image of the light valve and the surface;
   d) imaging a first set of features in a first area of the resist without imaging a second set of features interspersed with the first set of features in the first area by supplying a first set of data to the light valve while scanning the image across the first area; and, e) imaging the second set of features by supplying a second set of data to the light valve while scanning the image across the first area.

2. The method of claim 1 wherein, during imaging the first and second sets of features the resist does not operate according to the law of reciprocity.

3. The method of claim 1 wherein the resist comprises a thermoresist.

4. The method of claim 1 wherein imaging the second set of features comprises scanning the image across the first area with the image partially overlapping the first area.

5. The method of claim 4 wherein the first area is a region of overlap between first and second generally parallel-sided stripes.

6. The method of claim 4 comprising providing a variable focus optical system wherein forming an image of the light valve on a surface bearing a resist comprises imaging the light valve on the surface of the resist with the variable focus optical system, imaging the first set of features comprises supplying the first set of data to the light valve while scanning the image across the first area with the optical system at a first focus setting and subsequently supplying the first set of data to the light valve while scanning the image across the first area with the optical system at a second focus setting.

7. The method of claim 1 comprising providing a variable focus optical system wherein forming an image of the light valve on a surface bearing a resist comprises imaging the light valve on the surface of the resist with the variable focus optical system, imaging the first set of features comprises supplying the first set of data to the light valve while scanning the image across the first area with the optical system at a first focus setting and subsequently supplying the first set of data to the light valve while scanning the image across the first area with the optical system at a second focus setting.

8. The method of claim 7 wherein imaging the second set of features comprises supplying the second set of data to the light valve while scanning the image across the first area with the optical system at the first focus setting and subsequently supplying the second set of data to the light valve while scanning the image across the first area with the optical system at the second focus setting.

9. The method of claim 1 wherein the light valve emits leakage light when it is in an off state and the leakage light produces a light level at the surface greater than 1% of a light level produced when the light valve is in an on state.

10. The method of claim 9 wherein the leakage light produces a light level at the surface greater than 10% of the light level produced at the surface when the light valve is in its on state.

11. The method of claim 1 wherein the first area is a substantially parallel-sided stripe.

12. The method of claim 1 wherein the light source comprises a laser.

13. The method of claim 12 wherein the laser illuminates the light valve with infrared light.

14. The method of claim 12 wherein the laser illuminates the light valve with visible light.

15. The method of claim 12 wherein the laser illuminates the light valve with ultraviolet light.

16. The method of claim 12 wherein the light valve is a micromachined light valve.

17. The method of claim 10 wherein the light source comprises a frequency-quadrupled YAG laser.

18. The method of claim 1 comprising providing a variable focus optical system wherein forming an image of the light valve on the surface bearing the resist comprises imaging the light valve on the surface of the resist with the variable focus optical system, imaging the first set of features comprises scanning the image of the light valve across the surface of the resist two or more times with the optical system at a different focus setting during each of the two or more scans, the scans temporally separated sufficiently for heat in the surface to dissipate between scans.

19. The method of claim 18 wherein imaging the second set of features comprises scanning the image of the light valve across the surface of the resist two or more times with the optical system at a different focus setting during each of the two or more scans, the scans temporally separated sufficiently for heat in the surface to dissipate between scans.

20. The method of any of claims 1 to 19 used in a process for manufacturing integrated circuits.

21. The method of any of claims 1 to 19 used in a process for manufacturing printed circuit boards.

22. The method of any of claims 1 to 19 used in a process for manufacturing flat panel displays.

* * * * *